(12) United States Patent
Hsueh et al.

(10) Patent No.: US 7,795,646 B2
(45) Date of Patent: Sep. 14, 2010

(54) SEMICONDUCTOR DEVICE

(75) Inventors: Kuan-Po Hsueh, Tainan County (TW); Kuo-Hung Wu, Tainan County (TW)

(73) Assignee: Himax Analogic, Inc., Tainan County (TW)

( * ) Notice: Subject to any disclaimer, the term of this patent is extended or adjusted under 35 U.S.C. 154(b) by 89 days.

(21) Appl. No.: 12/078,683

(22) Filed: Apr. 3, 2008

(65) Prior Publication Data

US 2009/0250773 A1 Oct. 8, 2009

(51) Int. Cl.
*H01L 23/528* (2006.01)
(52) U.S. Cl. .................. 257/211; 257/758; 257/776; 257/E23.142; 257/E23.151
(58) Field of Classification Search ............... 257/758, 257/734, 773, 768, 211, 207, 776, E23.412, 257/E23.151
See application file for complete search history.

(56) References Cited

U.S. PATENT DOCUMENTS

| | | | | |
|---|---|---|---|---|
| 6,809,419 | B2 * | 10/2004 | Minami et al. | 257/758 |
| 6,933,562 | B1 * | 8/2005 | Hopper et al. | 257/341 |
| 2008/0054307 | A1 * | 3/2008 | Shimizu | 257/207 |

* cited by examiner

*Primary Examiner*—Victor A Mandala
*Assistant Examiner*—Scott Stowe
(74) *Attorney, Agent, or Firm*—Rabin & Berdo, PC

(57) ABSTRACT

A semiconductor device includes a first metal region, a plurality of vias, a plurality of second metal regions, a plurality of openings and a third metal region. The first metal region conducts source/drain current. The second metal regions are electrically connected to the first metal region through the vias for conducting the source/drain current, in which each of the second metal regions is disposed in a distance from the adjacent second metal regions. The third metal region is electrically connected to the second metal regions through the openings, in which the resistance of the third metal region is smaller than the resistances of the first metal region and the second metal regions.

12 Claims, 7 Drawing Sheets

SEMICONDUCTOR DEVICE

BACKGROUND

1. Field of Invention

The present invention relates to a semiconductor device. More particularly, the present invention relates to a circuit layout of a semiconductor device.

2. Description of Related Art

The physical structure of a semiconductor device determines the performance of the semiconductor. For example, the channel width and the channel length of a semiconductor device affect the current volume of the semiconductor device. The semiconductor device usually includes the metal layer. The metal layer used to pass the source/drain current also affects the conductivity of the semiconductor device.

In the amplifier, the switch usually conducts source/drain current by the single metal layer which is usually made of cooper. Because the switch usually conducts a large amount of current, the current density of the single metal layer in the switch is high. As a result, the single metal layer might be irregularly short together or be open-circuited due to the electro-migration effect.

Therefore, there is a need for a new semiconductor device which can disperse the current and reduce the current density to prevent the metal layer from being irregularly short together or open-circuited.

SUMMARY

The structure of a semiconductor device is disclosed. According to one embodiment of the present invention, the semiconductor device includes a first metal region, a plurality of vias, a plurality of second metal regions, a plurality of openings and a third metal region. The first metal region conducts source/drain current. The vias are disposed on the first metal region. The second metal regions are electrically connected to the first metal region through the vias to conduct the source/drain current, in which each of the second metal regions is disposed in a distance from the adjacent second metal regions.

The openings are disposed on the second metal regions. The third metal region is electrically connected to the second metal regions through the openings, in which the resistance of the third metal region is smaller than the resistance of the first metal region and the resistance of the second metal regions.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1A:
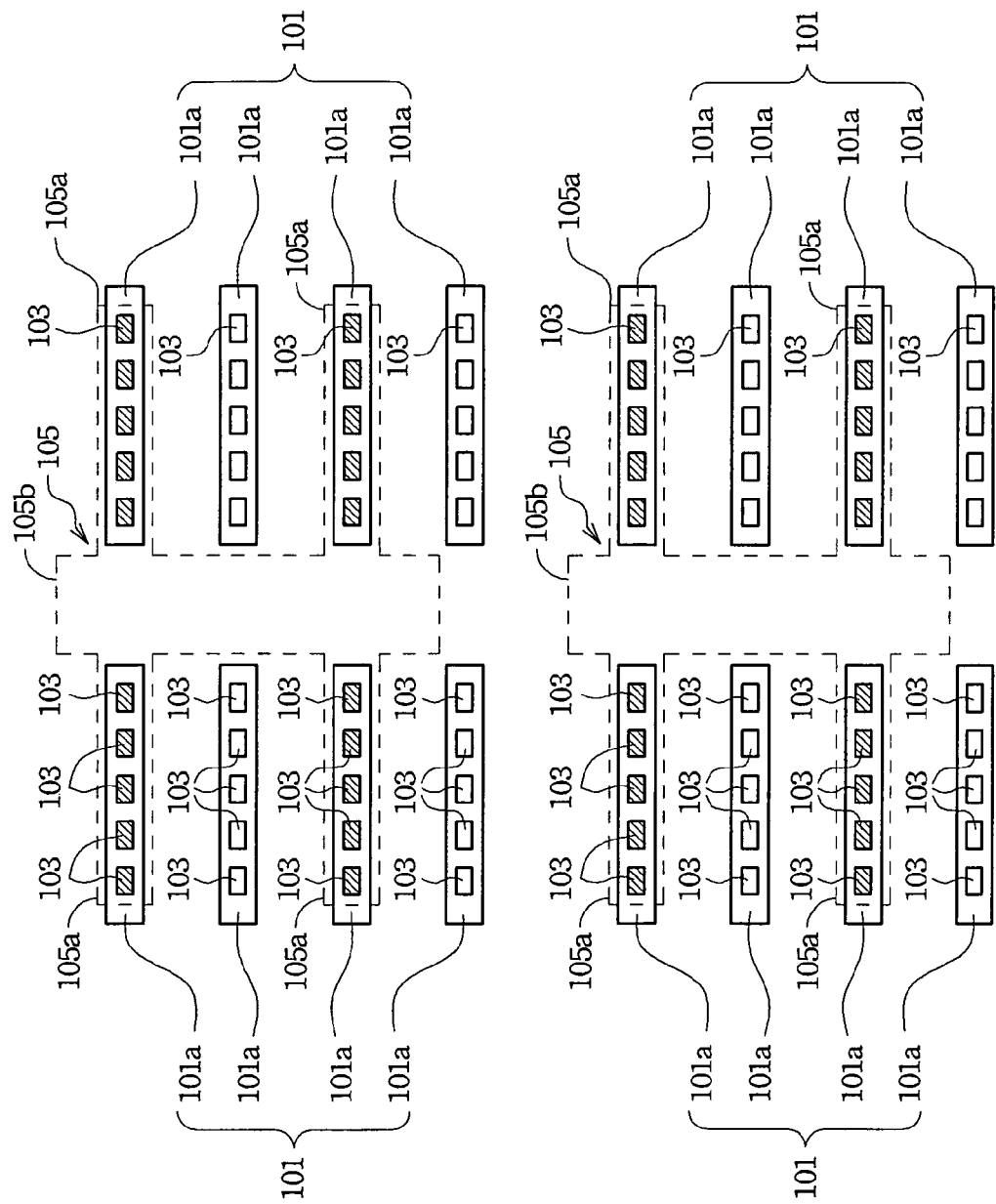
FIG. 1A shows some parts of the semiconductor device according to a first embodiment of the present invention.
Figure 1B:
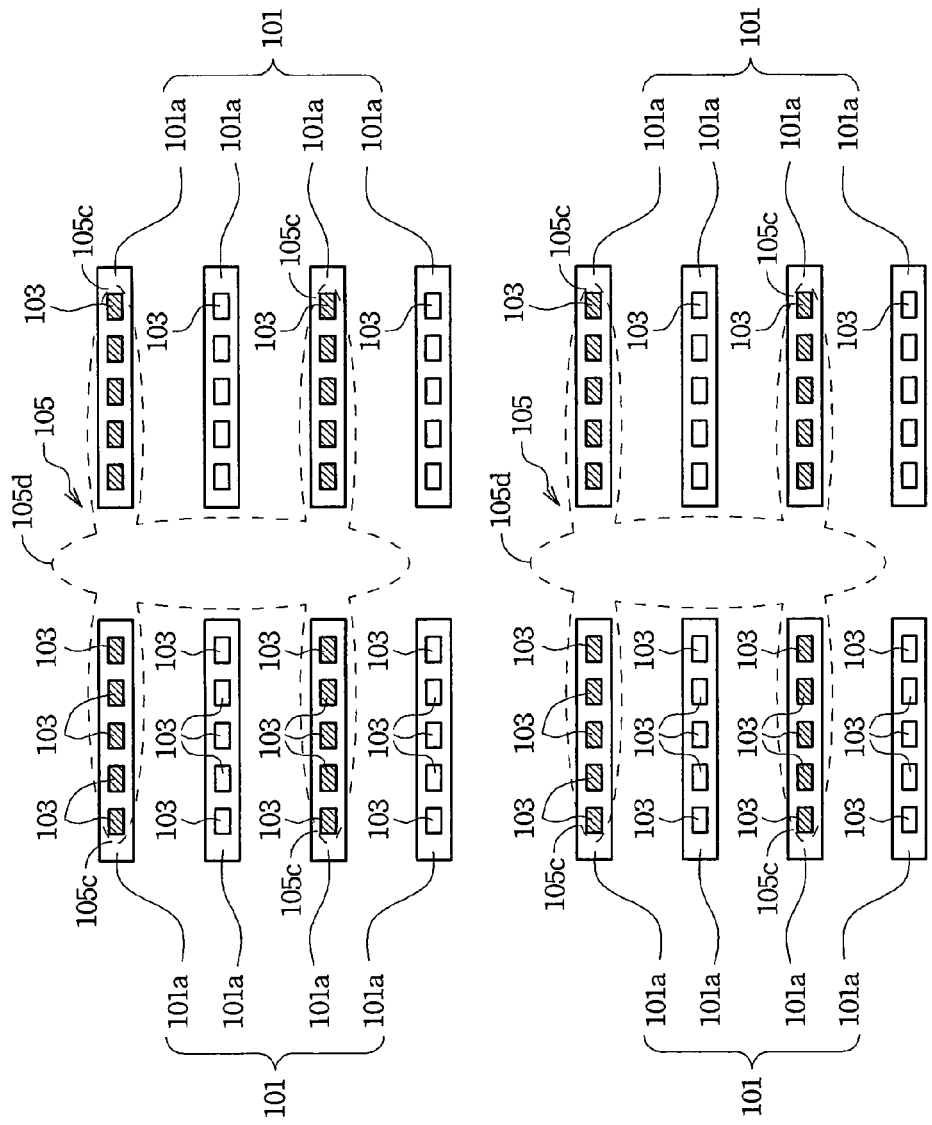
FIG. 1B shows some parts of the semiconductor device according to a second embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The semiconductor device in the following embodiments includes several metal layers to conduct the source/drain current, which can disperse the current and reduce the current density. As a result, the metal layers of the semiconductor device can be prevented from being short-circuited or open-circuited due to the electro-migration effect.

Figure 1C:
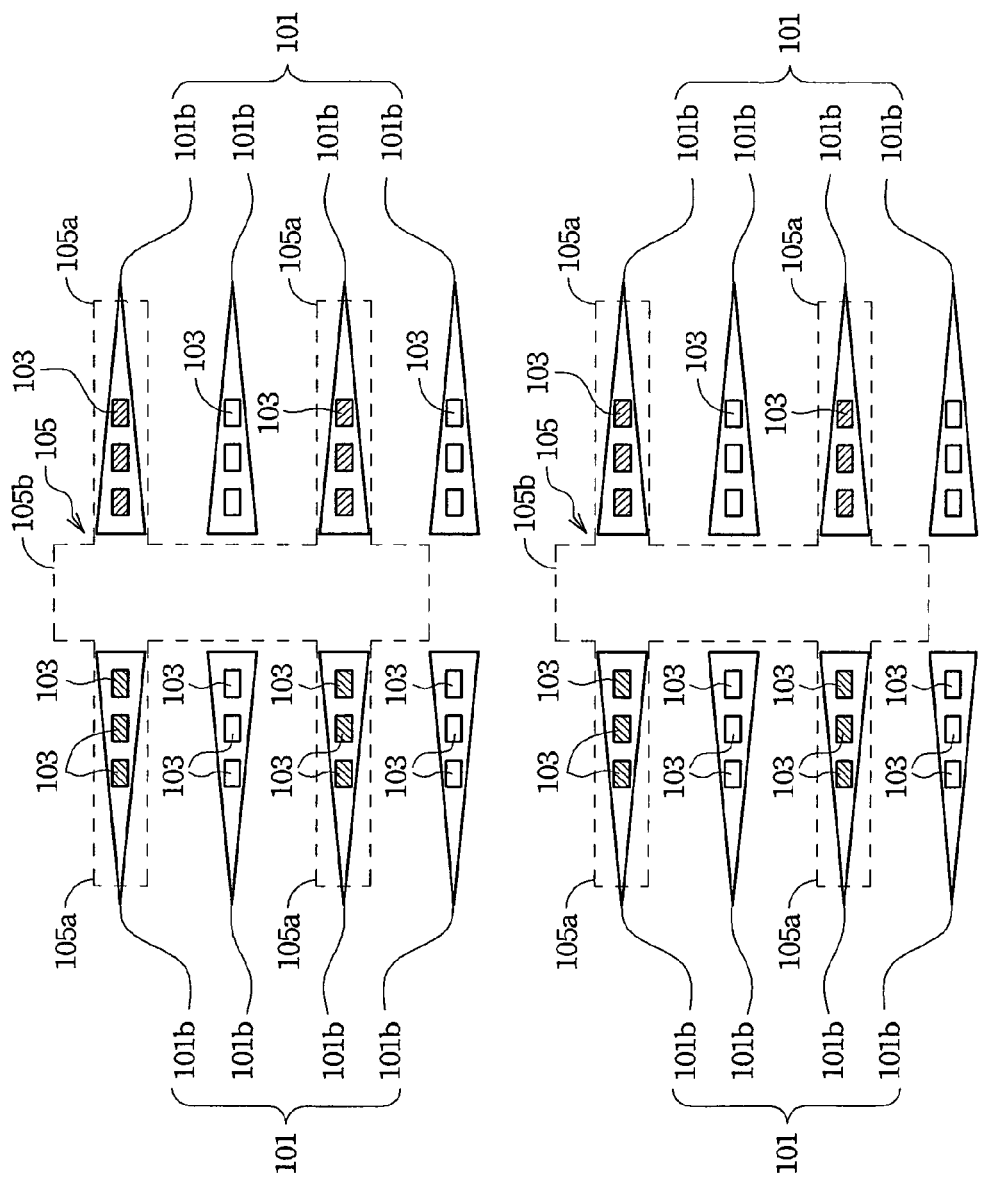
FIG. 1C shows some parts of the semiconductor device according to a third embodiment of the present invention.
Figure 1D:
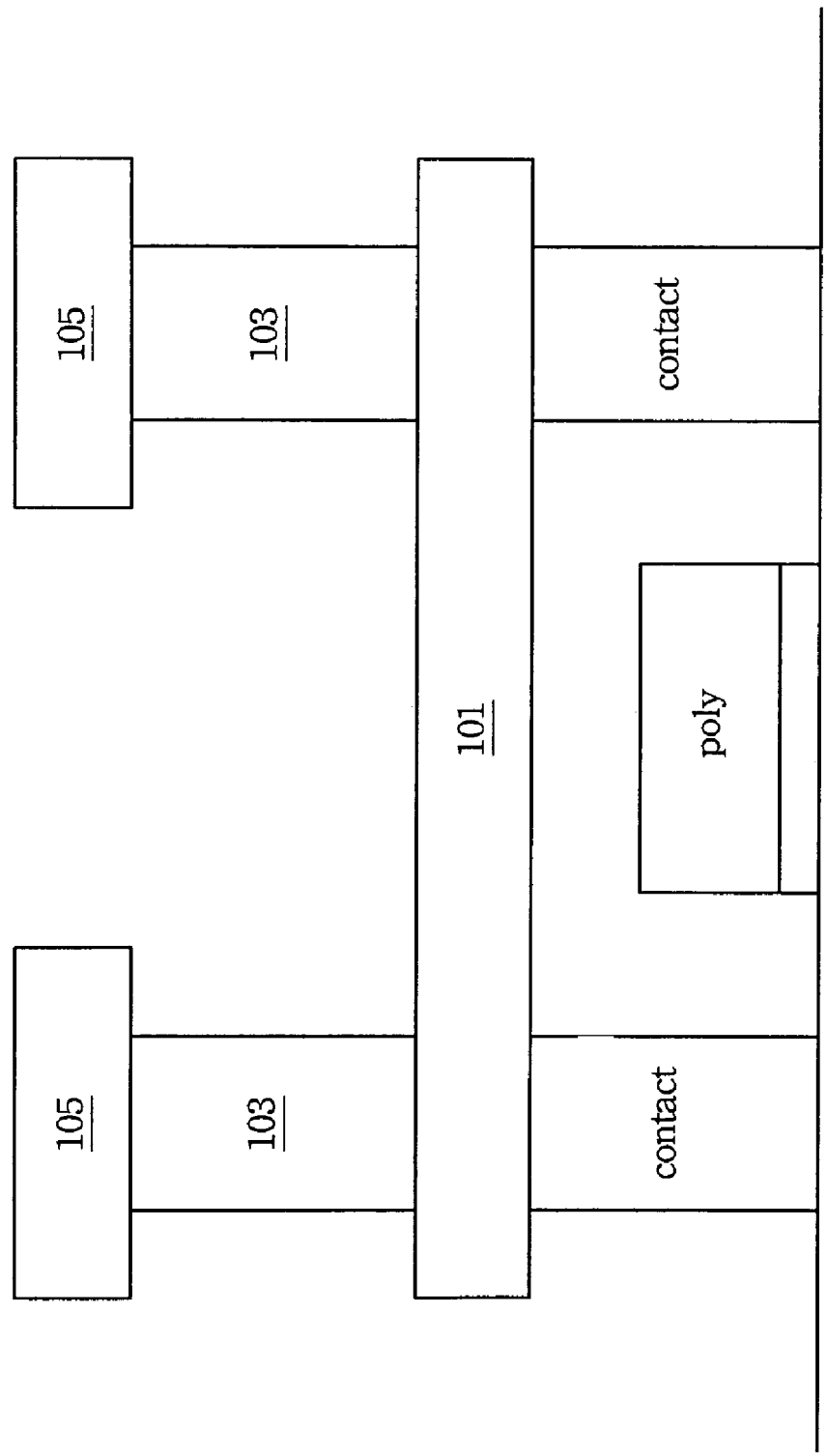
FIG. 1D shows the cross sectional view of the parts of the semiconductor device according to the first embodiment of the present invention.

FIG. 1A shows some parts of the semiconductor device according to a first embodiment of the present invention. FIG. 1D shows the cross sectional view of the parts of the semiconductor device according to the first embodiment of the present invention. The semiconductor device includes the first metal regions 101, the second metal regions 105, and the vias 103. The first metal region 101, made of aluminum (Al), platinum (Pt), stannum (Sn) or other metal, includes the fourth pieces 101a. Each of the fourth pieces 101a can be electrically connected to the other fourth pieces 101a, or be disposed in a distance from the adjacent fourth pieces 101a. Each fourth piece 101a can be shaped as a bar, a rectangular, a triangle, a polygon, or an ellipse. For example, FIG. 1C shows a semiconductor device according to a third embodiment of the present invention, in which each fourth piece 101a is of a triangle shape.

The first metal regions 101 connect with the source/drain of the semiconductor device through the contacts for conducting the source/drain current. The vias 103 are disposed on the first metal region 101. The second metal regions 105, made of aluminum, platinum, stannum or other metal, are electrically connected to the first metal region 101 through the vias 103 for conducting the source/drain current, in which each of the second metal regions 105 is disposed in a distance from the adjacent second metal regions 105.

Each of the second metal regions 105 includes the first piece 105b and the second pieces 105a. The first piece 105b and the second piece 105a can be rectangular, oval-shaped, polygon or other shapes. The second pieces 105a extend from the first piece 105b and overlap the first metal region 101 to cover the vias 103 disposed on the first metal region 101, in which the first piece 105b and the four second pieces 105a are shaped as a double cross. Therefore, the second piece 105a can receive the source/drain current from the first metal region 101 through the vias 103.

Figure 2:
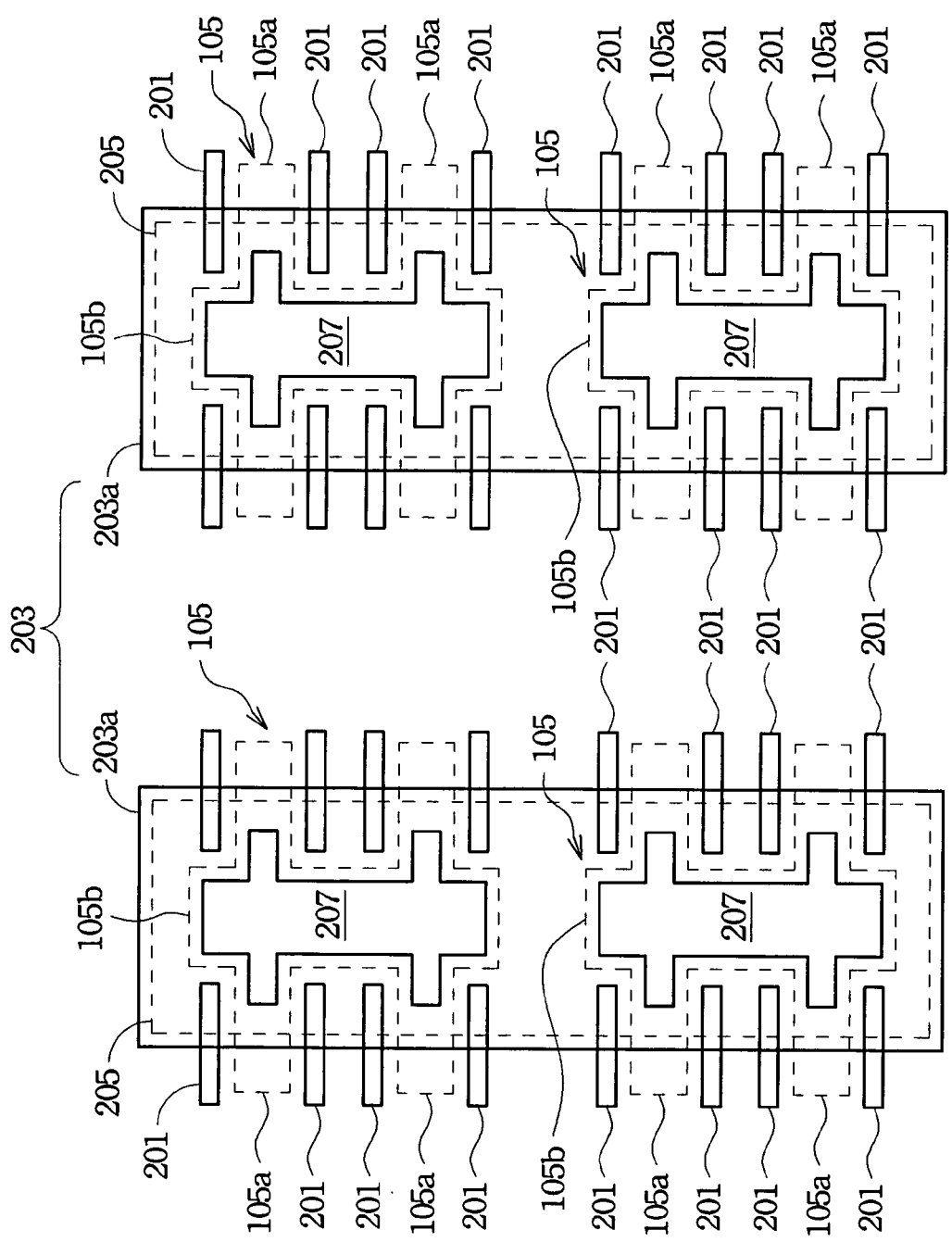
FIG. 2 shows further parts of the semiconductor device according to the first embodiment of the present invention.

FIG. 2 shows further parts of the semiconductor device according to the first embodiment of the present invention. In this angle of view, the first metal regions 101, not shown in FIG. 2, are disposed under the second metal region 105. The first openings 207, such as CB, are disposed on the second metal regions 105. The third metal region 203 is electrically connected to the second metal regions 105 through the first openings 207.

The third metal region 203 includes the third pieces 203a. Each of the third pieces 203a is disposed across the second pieces 105a of the second metal regions 105, and disposed in a distance from other third pieces 203a. The third metal region 203 can be gold, such that the resistance of the third metal region 203 is less than the resistance of the first metal region 101 and the second metal regions 105 which are made of aluminum (Al), platinum (Pt), stannum (Sn) or other metal.

The first metal region 101 conducts the source/drain current of the semiconductor device. In an other way, the third metal region 203 can also conduct the source/drain current. Because each second metal region 105 is disposed in a distance from other second metal regions 105, the current from the source/drain cannot be conducted from one second metal region 105 to another second metal region 105. Thus, the source/drain current needs to go to the third metal region 203 through the second metal regions 105, and be conducted by the third metal region 203.

In other words, the current can be conducted in two ways: it can be conducted merely through the first metal region 101, or it can be conducted through the first metal region 101, the second metal region 105, and the third metal region 203. As a result, the source/drain current can be dispersed into two parts, which reduces the current density and prevents the electro-migration effect. In addition, because the resistance of the third metal region 203 made of gold is less than the resistance made of other metal, the semiconductor device has better electric conductivity.

In addition to the first metal region 101, the second metal region 105 and the third metal region 203, a protection layer (not shown) may be arbitrarily formed between the second metal region 105 and the third metal region 203 for protecting and flatting the semiconductor device. Then, the bump wires 211 are electrically connected to the third metal region 203 through the second openings 205 disposed on the third metal region 203 for receiving a voltage.

The semiconductor device further includes the polysilicon strips 201. Each of the polysilicon strips 201 is disposed in a distance from other polysilicon strips 201, and in a distance from the second metal regions 105. The polysilicon strip 201 forms the gate of the semiconductor device. The current channel is induced while the gate receives a suitable gate voltage.

Figure 3:
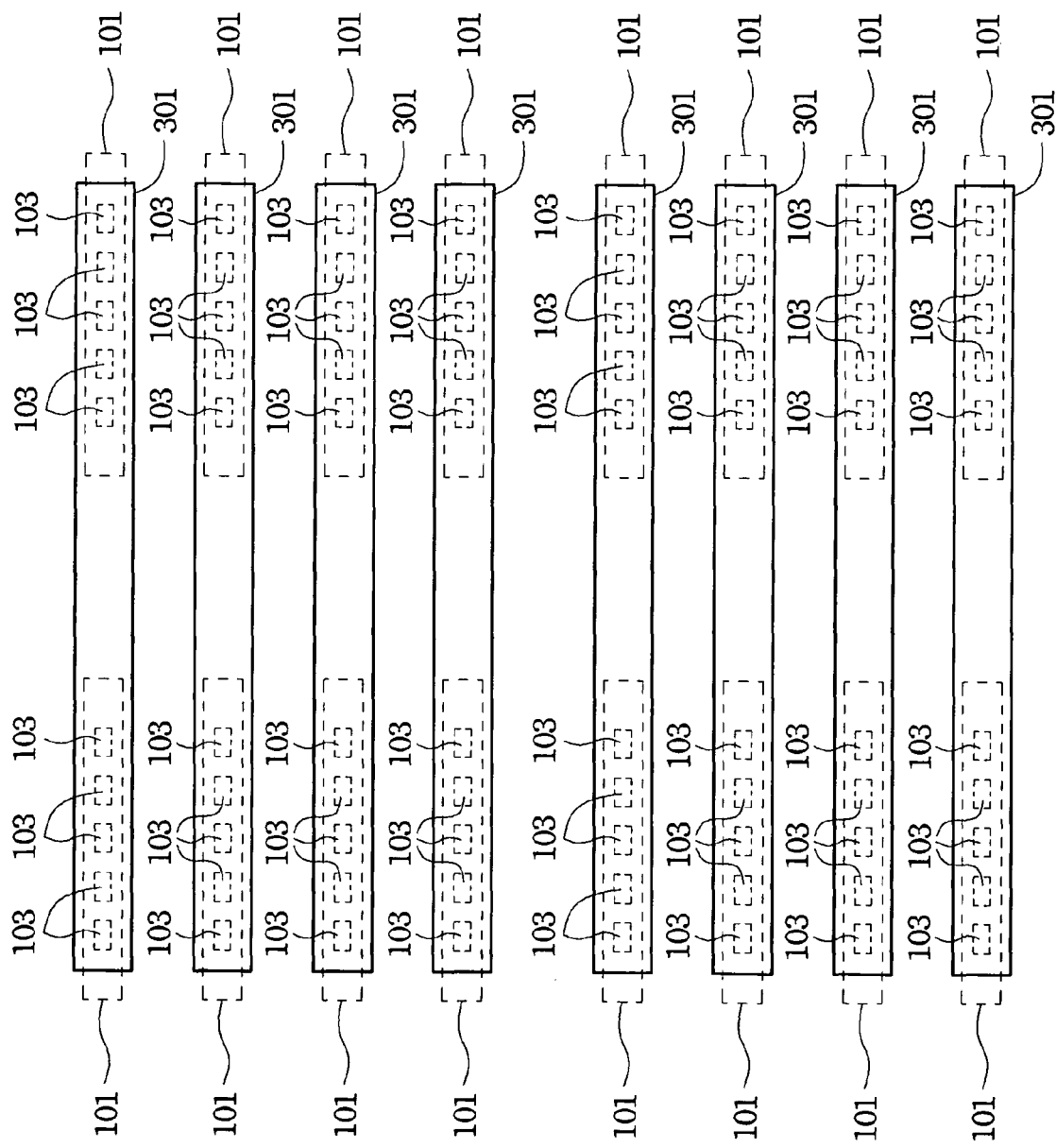
FIG. 3 shows some parts of the semiconductor device according to a fourth embodiment of the present invention.
Figure 4:
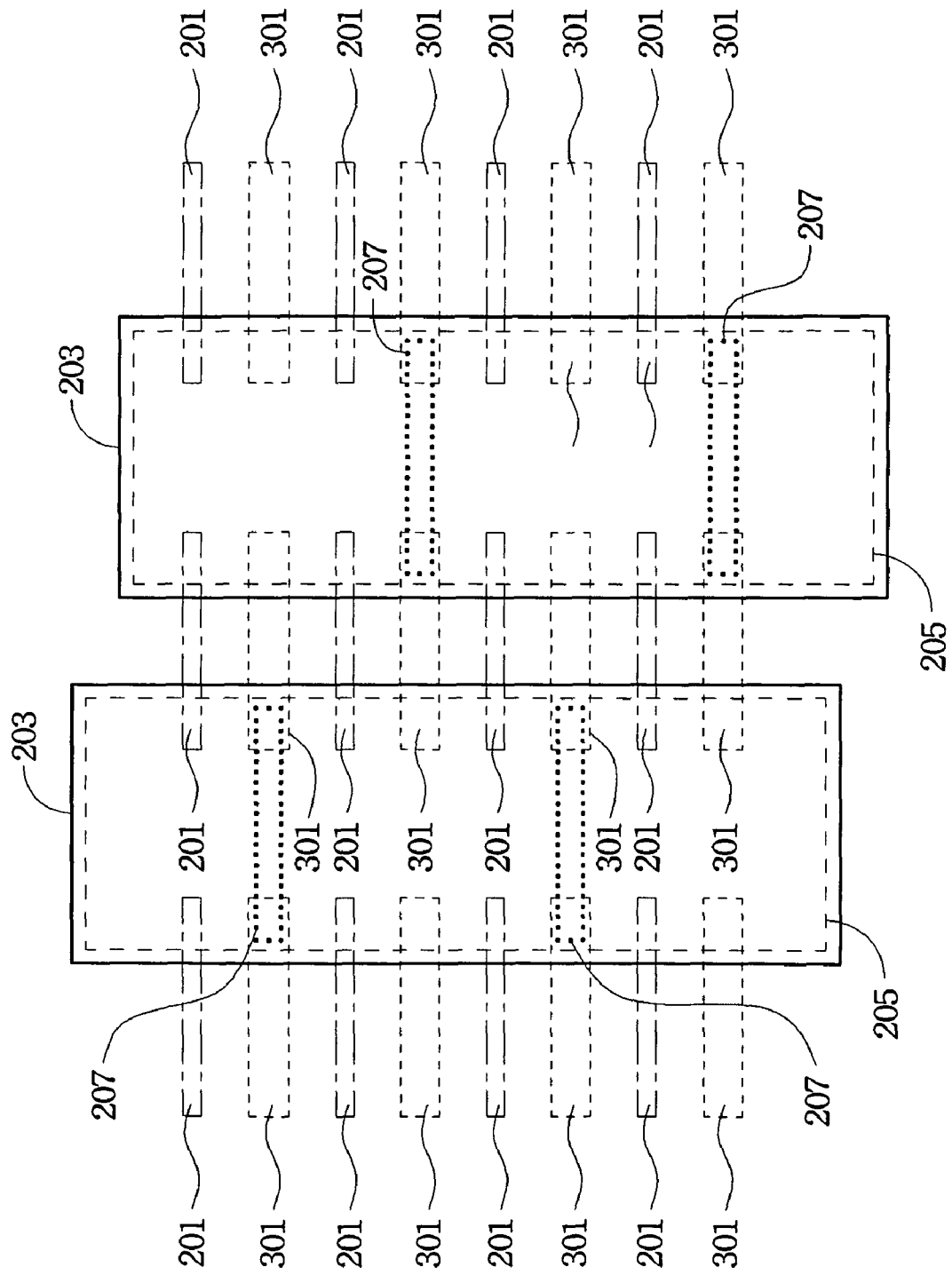
FIG. 4 shows further parts of the semiconductor device according to the fourth embodiment of the present invention.

Please refer to both FIG. 3 and FIG. 4. FIG. 3 shows some parts of the semiconductor device according to a fourth embodiment of the present invention. FIG. 4 shows further parts of the semiconductor device according to the fourth embodiment of the present invention. The second metal regions 301 are electrically connected to the first metal region 101 through the vias 103, therefore the second metal regions 301 can receive the source/drain current from the first metal region 101 through the vias 103. The structure of the semiconductor device in this embodiment are similar to the structures shown in FIG. 1A and FIG. 2, except that each of the second metal regions 301 is shaped as a bar in this embodiment.

Because each second metal region 301 is disposed in a distance from other second metal regions 301, the current from source/drain cannot be conducted from one second metal region 301 to another second metal region 301. Thus, the source/drain current needs to go to the third metal region 203 through the second metal regions 301, and be conducted by the third metal region 203.

According to above embodiments, the source/drain current in the semiconductor device can be dispersed into two parts, which reduces the current density and prevents the electro-migration effect. In addition, because the resistance of the third metal region made of gold is less than the resistance made of other metal, the semiconductor device has better electric conductivity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
    a first metal region for conducting source/drain current;
    a plurality of vias disposed on the first metal region;
    a plurality of second metal regions, electrically connected to the first metal region through the vias, for conducting the source/drain current, each of the second metal regions being disposed in a distance from the adjacent second metal regions, and having:
        a first piece, and
        four second pieces extending from the first piece, the first piece and the four second pieces being shaped as a double cross, the second pieces overlapping the first metal region for covering the vias disposed on the first metal region, and receiving the source/drain current form the first metal region through the vias;
    a plurality of openings disposed on the second metal regions; and
    a third metal region electrically connected to the second metal regions through the openings, wherein a resistance of the third metal region is smaller than the resistance of the first metal region and the resistance of the second metal regions.

2. The semiconductor device as claimed in claim 1, wherein the first piece and the second piece are rectangular.

3. The semiconductor device as claimed in claim 1, wherein the first piece and the second piece are ellipses.

4. The semiconductor device as claimed in claim 1, wherein the second metal regions are made of aluminum (Al), platinum (Pt) or stannum (Sn).

5. The semiconductor device as claimed in claim 1, wherein the third metal region comprises a plurality of third pieces, each of the third pieces is disposed across the second pieces of the second metal regions, and disposed in a distance from other third pieces.

6. The semiconductor device as claimed in claim 1, wherein the third metal region is made of gold.

7. The semiconductor device as claimed in claim 1, wherein the first metal region comprises a plurality of fourth pieces, each of the fourth pieces is disposed in a distance from the adjacent fourth pieces.

8. The semiconductor device as claimed in claim 7, wherein each fourth piece is shaped as a bar.

9. The semiconductor device as claimed in claim 7, wherein each fourth piece is a triangle.

10. The semiconductor device as claimed in claim 1, wherein the first metal region is made of Al, Pt, or Sn.

11. The semiconductor device as claimed in claim 1, further comprising a plurality of polysilicon strips, each of the polysilicon strips is disposed in a distance from other polysilicon strips, and in a distance from the second metal regions.

12. The semiconductor device as claimed in claim 1, further comprising a plurality of bump wires electrically connected to the third metal region for receiving a voltage.

* * * * *